United States Patent [19]

Lischke et al.

[11] Patent Number: 4,924,136
[45] Date of Patent: May 8, 1990

[54] BEAM GENERATING SYSTEM FOR ELECTRON BEAM MEASURING INSTRUMENTS HAVING CATHODE SUPPORT STRUCTURE

[75] Inventors: Burkhard Lischke; Dieter Winkler, both of Munich, Fed. Rep. of Germany

[73] Assignee: Siemens Aktiengesellschaft, Berlin and Munich, Fed. Rep. of Germany

[21] Appl. No.: 219,580

[22] Filed: Jul. 15, 1988

[30] Foreign Application Priority Data

Sep. 28, 1987 [DE] Fed. Rep. of Germany ....... 3732620

[51] Int. Cl.$^5$ ............................................. H01J 1/18
[52] U.S. Cl. ................. 313/336; 313/346 R; 313/292
[58] Field of Search ............ 313/336, 346 R, 346 DC, 313/270, 292

[56] References Cited

U.S. PATENT DOCUMENTS 4,430,570 2/1984 Takigawa et al. .............. 313/336 X
4,482,839 11/1984 Wada et al. ..................... 313/336 X

FOREIGN PATENT DOCUMENTS 3150848 3/1981 Fed. Rep. of Germany .

OTHER PUBLICATIONS

Hohn, "Development and Use of High Brightness Lanthanum Hexaboride Electron Guns", Scanning Electron Micro., 12/1985, pp. 1327-1338.
Schmidt et al, "Design and Optimization of Directly Heated Lab6 Cathode Assemblies for Electron-Beam Inst.", Jul./Aug. 1987, 15(4).

Primary Examiner—Kenneth Wieder
Attorney, Agent, or Firm—Hill, Van Santen, Steadman & Simpson

[57] ABSTRACT

Beam generating system for electron beam measuring instruments. In prior art beam generators, the life expectancy of directly heated boride cathodes is limited by their thermally disadvantageous mount. The present invention provides a cathode not clamped at the lower end of the crystal shank as was previously standard, but clamped immediately below the cathode tip. The inventive mount of the boride cathode results in the crystal being only insignificantly hotter in the region of the clamping plane than at the electron-emitting tip.

9 Claims, 1 Drawing Sheet

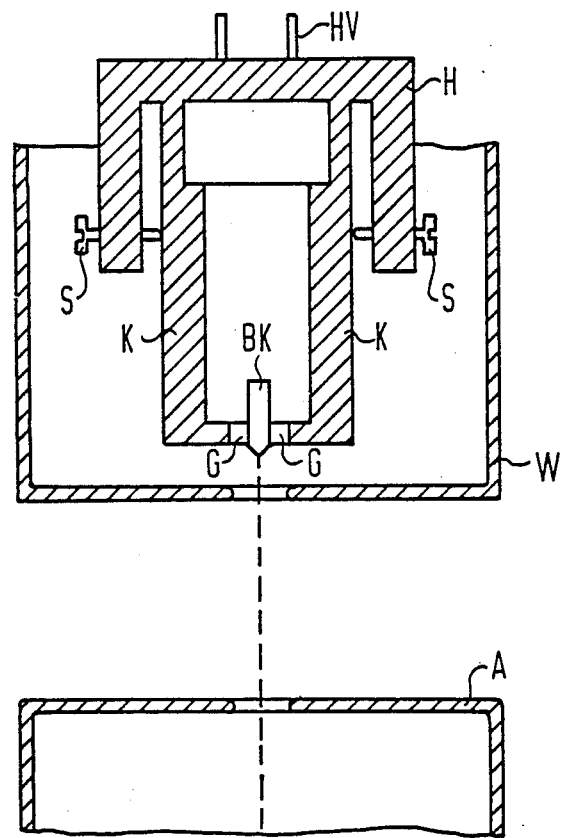

BEAM GENERATING SYSTEM FOR ELECTRON BEAM MEASURING INSTRUMENTS HAVING CATHODE SUPPORT STRUCTURE

BACKGROUND OF THE INVENTION

The present invention is directed to a beam generating system for electron beam measuring instruments, particularly, a beam generating system for electron beam measuring instruments having an electron accelerating electrode, a control electrode, a directly heated boride cathode and a holding part for the absorption of the retaining forces generated by the clamping mechanism.

Prior art beam generating systems are disclosed, for example, in J. Vac. Sci. Technol. 15 (4), 1978, pages 1554 through 1560 (in particular, see page 1558, FIG. 7) and in German patent DE 31 50 848. The life expectancy of lanthanum hexaboride (LaB6) crystals used as cathodes in these beam generating systems is limited by their thermally disadvantageous mount. As a consequence of a temperature gradient existing between a tip of the crystal and a shank of the crystal, an increased evaporation rate occurs in the region of the mount in comparison to the tip. The evaporation rate destroys the mechanical stability of the cathode (see, for example, Scanning Electron Microscopy, 1985/4, pages 1327 through 1338, particularly page 1331, FIG. 6a).

SUMMARY OF THE INVENTION

An object of the present invention is to provide a beam generally system of the type initially cited having a thermally and mechanically improved cathode mount. The present invention provides a beam generating system for electron beam measuring instruments having an electron accelerating electrode, a control electrode, a directly heated boride cathode and a holding part for the absorption of the retaining forces generated by the clamping mechanism. The holding part is located immediately under electron-emitting regions of the boride cathode.

The advantage obtainable with the present invention is that the life expectancy of a boride cathode can be noticeably enhanced. Further, a significantly lower power is required for heating the cathode to the required operating temperature.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

The single FIGURE shows the schematic structure of a beam generating system of the present invention.

DESCRIPTION OF THE PREFERRED EMBODIMENT

A beam generator for electron beam measuring instruments, particularly scanning electron microscopes and electron beam testers, schematically shown in the FIGURE, is essentially composed of an anode A usually being at a grounded potential, of a control electrode W (for example, a Wehnelt electrode) and of a directly heated boride cathode BK that a mount H holds centered in an opening of the control electrode W. The control electrode W is negatively biased in comparison to the cathode BK. The mount H has two set screws S and a clamping mechanism composed of two metallic clamps K. This clamping mechanism transmits the retaining forces generated by the set screws S onto the two graphite cubes G located immediately below the tip of the lanthan hexaboride (LaB6) crystal of the cathode BK. As a consequence of this thermically and mechanically beneficial mount, only a low heating power of, for example, 10 watts is needed in order to bring the boride cathode BK, which is in a high vacuum ($10^{-6}$ through $10^{-7}$ Torr), to the required operating temeperature range of about 1200° C. to 1800° C. A filament voltage is supplied to the system via the terminal posts HV to provide a cathode potential of about $-3$ kV through $-30$ kV.

The inventive mount of the cathode BK guarantees that the LaB6 crystal is only insignificantly hotter at the clamping location than it is at the electron-emitting tip. A considerably lower evaporation rate results, particularly at crystal faces lying opposite the graphite cubes G, in comparison to prior art cathode mounts which have a high temperature difference between their crystal tips and crystal shanks in the region of the electrical contacts. The electrical contact is also preserved for a longer operating period of the cathode BK. Moreover, its mechanical stability is not deteriorated by a reduction of the crystal cross section above the clamping location which can be observed in prior art systems.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A beam generating system for electron beam measuring instruments having an electron-accelerating electrode, a control electrode, a directly heated boride cathode having a tip for emitting electrons and a cathode mount that has a clamping mechanism, the clamping mechanism contacting the boride cathode via a means for holding comprising the means for holding located immediately under the tip for emitting electrons of the boride cathode.

2. The beam generating system according to claim 1, wherein the boride cathode is a lanthan hexaboride cathode.

3. The beam generating system according to claim 1, wherein the holding part is composed of graphite.

4. The beam generating system according to claim 3, wherein the holding part is composed of two graphite cubes.

5. A beam generating system for electron beam measuring instruments having an electron accelerating electrode for accelerating electrons in an electron beam, a control electrode, and a directly heated boride cathode having a tip for emitting electrons and held in a cathode mount that has a clamping mechanism, the clamping mechanism contacting the boride cathode via a means for holding, comprising the means for holding located immediately under and adjacent to the tip for emitting electrons of the boride cathode.

6. The beam generating system according to claim 5, wherein the boride cathode is a lanthan hexaboride cathode.

7. The beam generating system according to claim 5, wherein the holding part is composed of graphite.

8. The beam generating system according to claim 5, wherein the holding part is composed of two graphite cubes.

9. A beam generating system for electron beam measuring instruments having an electron accelerating electrode for accelerating electrons in an electron beam, a control electrode and a directly heated lanthan hexaboride cathode having a tip for emitting electrons and held in a cathode mount that has a clamping mechanism, the clamping mechanism contacting the cathode via a means for holding, comprising the means for holding located immediately under the tip for emitting electrons of the cathode, the means for holding being composed of two graphite cubes for contacting opposed sides of the cathode.

* * * * *